(12) United States Patent
Lee (10) Patent No.: US 10,070,519 B2
(45) Date of Patent: Sep. 4, 2018

(54) RESIN COMPOSITION FOR PACKAGING AND PRINTED CIRCUIT BOARD USING THE SAME

(71) Applicant: SAMSUNG ELECTRO-MECHANICS CO., LTD., Suwon-si (KR)

(72) Inventor: Sung Chul Lee, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 36 days.

(21) Appl. No.: 15/136,231

(22) Filed: Apr. 22, 2016

(65) Prior Publication Data

US 2016/0353570 A1     Dec. 1, 2016

(30) Foreign Application Priority Data

May 29, 2015     (KR) .................. 10-2015-0076659

(51) Int. Cl.
| | |
|---|---|
| *H05K 1/03* | (2006.01) |
| *C08K 7/00* | (2006.01) |
| *C08K 3/36* | (2006.01) |
| *C08K 3/40* | (2006.01) |
| *C08K 3/26* | (2006.01) |
| *C08K 3/013* | (2018.01) |

(52) U.S. Cl.
CPC .......... *H05K 1/0373* (2013.01); *C08K 3/26* (2013.01); *C08K 3/36* (2013.01); *C08K 3/40* (2013.01); *C08K 7/00* (2013.01); *C08K 3/013* (2018.01); *C08K 2003/265* (2013.01); *C08K 2201/016* (2013.01); *H05K 2201/0209* (2013.01); *H05K 2201/0248* (2013.01); *H05K 2201/0376* (2013.01)

(58) Field of Classification Search
USPC .......................................... 428/327; 430/201
See application file for complete search history.

(56) References Cited

U.S. PATENT DOCUMENTS

| | | | | |
|---|---|---|---|---|
| 4,273,806 | A | * | 6/1981 | Stechler .................... B29B 9/12 264/134 |
| 4,661,301 | A | * | 4/1987 | Okada ..................... B32B 27/12 264/41 |
| 4,798,762 | A | * | 1/1989 | Okada ..................... B32B 27/12 428/300.7 |
| 5,523,174 | A | * | 6/1996 | Tamaki .................... H05K 1/09 427/436 |

(Continued)

FOREIGN PATENT DOCUMENTS

| | | | |
|---|---|---|---|
| JP | 2004250482 | A * | 9/2004 |
| JP | 2009-147323 | A | 7/2009 |

(Continued)

*Primary Examiner* — William H Mayo, III
*Assistant Examiner* — Krystal Robinson
(74) *Attorney, Agent, or Firm* — NSIP Law (57) ABSTRACT

A resin composition for packaging, an insulating film and a printed circuit board manufactured with the resin composition, and a method of manufacturing a printed circuit board with the resin composition are provided. The resin composition for packaging includes an epoxy resin, and inorganic filler particles dispersed in the epoxy resin, and an aspect ratio of the inorganic filler particles is 1.0 or more and 3.0 or less.

18 Claims, 5 Drawing Sheets

(56) References Cited

U.S. PATENT DOCUMENTS

| | | | |
|---|---|---|---|
| 2004/0048057 A1* | 3/2004 | Kendall | B24D 3/002 |
| | | | 428/323 |
| 2010/0032202 A1* | 2/2010 | Higashitani | H05K 3/384 |
| | | | 174/264 |
| 2014/0079924 A1 | 3/2014 | Moon et al. | |
| 2014/0377539 A1* | 12/2014 | Matsumoto | C08L 9/06 |
| | | | 428/327 |
| 2014/0378580 A1 | 12/2014 | Amou | |

FOREIGN PATENT DOCUMENTS

| | | |
|---|---|---|
| JP | 2013-256637 A | 12/2013 |
| KR | 10-2014-0037650 A | 3/2014 |

* cited by examiner

RESIN COMPOSITION FOR PACKAGING AND PRINTED CIRCUIT BOARD USING THE SAME

CROSS-REFERENCE TO RELATED APPLICATION

This application claims the benefit under 35 USC 119(a) of Korean Patent Application No. 10-2015-0076659 filed on May 29, 2015, in the Korean Intellectual Property Office, the entire disclosure of which is incorporated herein by reference for all purposes.

BACKGROUND

1. Field

The following description relates to a resin composition for packaging, an insulating film and a printed circuit board using the same, and a method of forming a printed circuit board with the same.

2. Description of Related Art

A package substrate electrically connects a motherboard with electronic components such as semiconductor chips and the like. Due to the recent miniaturization of electronic devices having multi-functional capacities, the mounting density inside electronic component packages have increased. Thus, conductive printed circuit wires printed on substrates, on which electronic components are mounted, have become more complicated and have been highly densified.

The package substrate may include a copper layer (conductive wire) serving as a conductive circuit wiring and a polymer (insulating film) serving as interlayer insulation. In addition, in the package substrate, warpage of the substrate may occur due to a mounting temperature at the time of mounting electronic components, stress due to the use of the electronic components, and the like, and interlayer delamination or cracking between a conductive wire and an insulating substrate may occur due to a change in volume, or the like, caused by difference in a coefficient of thermal expansion between the conductive wire and the insulating film. Accordingly, defects may occur in the final product.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

In one general aspect, a resin composition for packaging includes an epoxy resin, and inorganic filler particles dispersed in the epoxy resin, wherein an aspect ratio of the inorganic filler particles is 1.0 or more and 3.0 or less.

The resin composition may have an inorganic filler particle content of 15% or less based on a total volume of the resin composition.

An aspect ratio of the inorganic filler particles may be approximately 2.0, and the resin composition may have an inorganic filler particle content of 15% or less based on a total volume of the resin composition.

An aspect ratio of the inorganic filler particles may be approximately 3.0, and the resin composition may have an inorganic filler particle content of 7% or less based on a total volume of the resin composition.

An aspect ratio of the inorganic filler particles may be 1.5 or more and 2.5 or less, and the resin composition may have an inorganic filler particle content of 5% or more and 15% or less based on a total volume of the resin composition.

The inorganic filler particles may be substantially uniformly dispersed within the resin composition.

The inorganic filler particles may have a columnar shape with one end being circular.

The inorganic filler particles may have a columnar shape with one end having an oval shape.

The inorganic filler particles may have a pipe shape.

The inorganic filler particles may include at least one selected from the group consisting of silica, glass, calcium carbonate.

In another general aspect, a printed circuit board includes an insulating film manufactured using a resin composition for packaging, the resin composition including an epoxy resin and inorganic filler particles dispersed in the epoxy resin, an aspect ratio of the inorganic filler particle being 1.0 or more and 3.0 or less, and a conductive wire formed on the insulating film.

The conductive wire may protrude into a surface of the insulating film by forming a depression, and a ratio c/a may be equal to or less than ½, wherein a width of a lower part of the depression at which the conductive wire protrudes into one surface of the insulating film is a, and a length of the inorganic filler particle is c.

In another general aspect, a method of manufacturing a printed circuit board involves forming an insulating film using a resin composition, the resin composition comprising an epoxy resin and inorganic filler particles dispersed in the epoxy resin, an aspect ratio of the inorganic filler particles being 1.0 or more and 3.0 or less, and forming a conductive wire as to contact the insulating film.

The forming of the insulating film may involve molding the insulating film to have a depression, and the forming of the conductive wire may involve filling the depression with a conductive material.

At least a portion of inorganic filler particles disposed at an interface between the insulating film and the conductive wire filled in the depression embeds into both the insulating film and the conductive wire.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative size, proportions, and depiction of elements in the drawings may be exaggerated for clarity, illustration, and convenience

DETAILED DESCRIPTION

The following detailed description is provided to assist the reader in gaining a comprehensive understanding of the methods, apparatuses, and/or systems described herein. However, various changes, modifications, and equivalents of the methods, apparatuses, and/or systems described herein will be apparent to one of ordinary skill in the art. The sequences of operations described herein are merely examples, and are not limited to those set forth herein, but may be changed as will be apparent to one of ordinary skill in the art, with the exception of operations necessarily occurring in a certain order. Also, descriptions of functions and constructions that are well known to one of ordinary skill in the art may be omitted for increased clarity and conciseness.

The features described herein may be embodied in different forms, and are not to be construed as being limited to the examples described herein. Rather, the examples described herein have been provided so that this disclosure will be thorough and complete, and will convey the full scope of the disclosure to one of ordinary skill in the art.

In the drawings, the shapes and dimensions of elements may be exaggerated for clarity, and the same reference numerals will be used throughout to designate the same or like elements.

Resin Composition for Packaging

An example of a resin composition for packaging according to the present description includes an epoxy resin and inorganic filler particles dispersed in the epoxy resin. An aspect ratio of the inorganic filler particles is 1.0 or more to 3.0 or less. Herein, the term "aspect ratio" refers to the length/diameter ratio of the inorganic filler particles.

According to one example, the aspect ratio of 2.0 may indicate that the average length/diameter ratio of inorganic filler particles in a resin composition is approximately 2.0.

The epoxy resin included in the resin composition is not specifically limited. However, the epoxy resin may, for example, include phenol-based glycidyl ether-type epoxy resins such as a phenol novolac-type epoxy resin, a cresol novolac-type epoxy resin, an ortho-cresol novolac (o-cresol novolac)-type epoxy resin, a naphthol-modified novolac-type epoxy resin, a bisphenol-A-type epoxy resin, a bisphenol-F-type epoxy resin, a biphenyl-type epoxy resin, a triphenyl-type epoxy resin, and the like; dicyclopentadiene-type epoxy resins having dicyclopentadiene skeletons, naphthalene-type epoxy resins having naphthalene skeletons, dihydroxy benzopyran-type epoxy resins, glycidyl amine-type epoxy resins having polyamine such as diaminodiphenyl methane, or the like, as a raw material, triphenol methane-type epoxy resins, tetraphenyl ethane-type epoxy resins or mixtures thereof, and the like.

According to one example, the epoxy resin may be N,N,N',N'-tetraglycidyl-4,4'-methylenebisbenzenamine, polyglycidyl ether of o-cresol-formaldehyde novolac or mixtures thereof.

An example of a resin composition for packaging may include the inorganic filler particle satisfying an aspect ratio of 1.0 or more to 3.0 or less.

In general, in a package substrate for mounting electronic components, warpage of the substrate may occur due to a mounting temperature at the time of mounting the electronic components, stress due to the use of the electronic components, and the like, and interlayer delamination or cracking between a conductive wire and an insulating film may occur due to a volume change, and the like, caused by difference in a coefficient of thermal expansion between the conductive wire and the insulating film. Accordingly, product defects may occur as a result thereof.

Because an example of the resin composition for packaging according to the present disclosure includes the inorganic filler particle satisfying an aspect ratio of 1.0 or more to 3.0 or less, adhesion between the conductive wire and the insulating film may be improved. In addition, stable adhesion may be implemented even though there is difference in volume change of the conductive wire and the insulating film according to the coefficient of thermal expansion.

Figure 1:
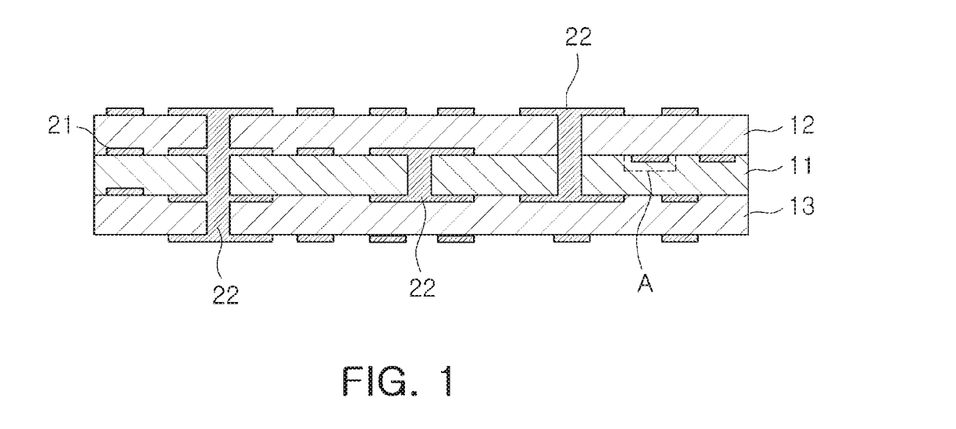
FIG. 1 is a cross-sectional view illustrating an example of a printed circuit board according to the present description.
Figure 2:
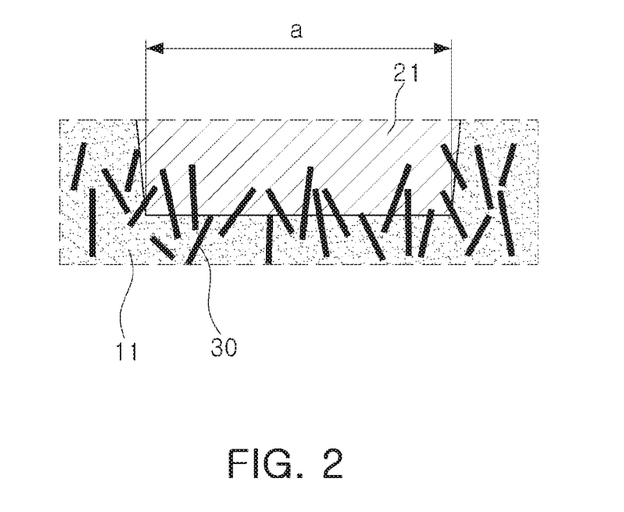
FIG. 2 is an enlarged cross-sectional view illustrating part A of the printed circuit board of FIG. 1.

FIG. 1 illustrates a cross-sectional view of an example of a printed circuit board, and FIG. 2 is an enlarged cross-sectional view of part A of FIG. 1.

Referring to FIG. 1, in the printed circuit board according to an example of the present description, a conductive wire 21 may penetrate or protrude into upper portions or some portions of insulating films 11, 12, and 13, using the resin composition for packaging. Referring to FIG. 2, the insulating films 11, 12, and 13 may include inorganic filler particles 30 dispersed therein, and portions of the inorganic filler particles 30 may penetrate into the conductive wire 21 so that the inorganic filler particles 30 embed in both the insulating films 11, 12, and 13 and the conductive wire 21.

In this example, the insulating films 11, 12, and 13 and the conductive wire 21 may adhere to each other through surfaces of the insulating films and the conductive wire that contact each other. For example, portions of the inorganic filler particles 30 extending from the insulating films 11, 12, and 13 may be included in the conductive wire 21, such that adhesion between the conductive wire 21 and the insulating films 11, 12, and 13 may be increased. In other words, different materials such as the insulating films 11, 12, and 13 and the conductive wire 21, may include the inorganic filler particles 30 distributed therein, thereby preventing mutual detachment and increasing adhesion between the two different materials and improving thermal properties.

According to one example, the inorganic filler particles included in the resin composition for packaging include at least one selected from the group consisting of silica, glass, calcium carbonate. However, but the present description is not limited to the above-described examples of the inorganic filler particles.

Figure 3:
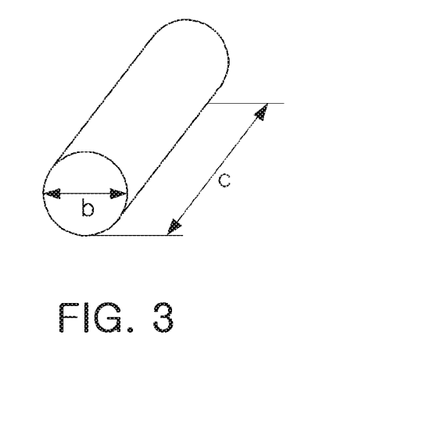
FIGS. 3 through 5 are perspective views respectively illustrating an inorganic filler particle included in examples of resin compositions.
Figure 4:
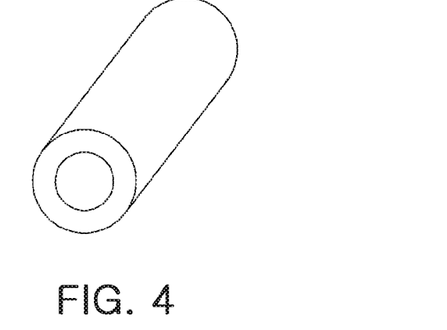
Figure 5:
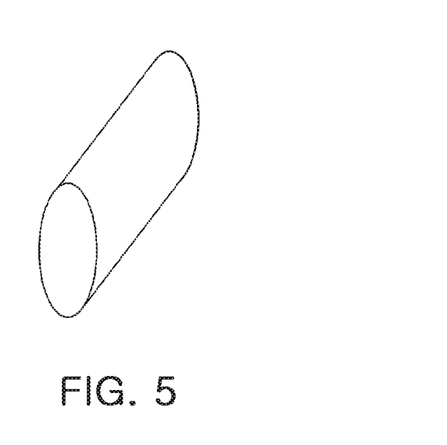

FIGS. 3 through 5 are perspective views illustrating examples of structures of inorganic filler particles included in a resin composition according to an example of the present description. The inorganic filler particles may have a columnar shape with one end being circular (see FIG. 3), or may have a pipe shape (see FIG. 4), or may have a columnar shape with one end having an oval shape (see FIG. 5).

In an example of a resin composition in which the inorganic filler particles have a columnar shape with one end being circular (see FIG. 3), when a diameter of a circle formed on an upper surface or a lower surface of the inorganic filler particles is b, and a length between the upper surface and the lower surface thereof is c, an aspect ratio of the inorganic filler particles may be obtained by c/b. In an example in which the inorganic filler particles have a pipe shape (see FIG. 4), the aspect ratio of the inorganic filler particles may be obtained as follows: "(length between upper surface and lower surface)/(diameter of circle positioned outermost in concentric circles formed on the upper surface or the lower surface of the inorganic filler particles)". In an example in which the inorganic filler particles have the columnar shape with one end having an oval shape (see FIG. 5), an aspect ratio of the inorganic filler particles may be obtained as follows: "(length between upper surface and lower surface)/(average length of longest diameter and shortest diameter of oval)".

By including inorganic filler particles, the resin composition for packaging exhibits excellent thermal properties and adhesive properties. Using the resin composition, the insulating film and the printed circuit board using the same, may be also provided. However, in the event that the content of inorganic filler particles is excessively high in a resin composition, formability of the resin composition may decrease. In the event that the formability of the resin composition is decreased, it may be difficult to manufacture the insulating film to have a desired shape or to manufacture the insulating film to be thin.

In order to maintain excellent formability, the content of inorganic filler particles included in a resin composition for packaging according to an example of the present description is 15% or less based on the total volume of the resin composition for packaging.

When the content of the inorganic filler particles is more than 15% by volume, since the content of the inorganic filler particles in the resin composition is excessively high, formability may be decreased, such that it may be difficult to manufacture a thin insulating film.

As methods of manufacturing the insulating film, there are a method of compression molding the resin composition to manufacture the insulating film and a method of pouring and molding the resin composition in a mold to manufacture the insulating film (hereinafter, referred to as a molding method). In the molding method, because the resin composition penetrates into the insides and corners of the mold, fluidity of the resin composition is significantly important. In addition, in the molding method, the fluidity of the resin composition is a factor having an influence on the formability of the resin composition, and the fluidity may be affected by the aspect ratio of the inorganic filler particles included in the resin composition.

Hereinafter, a relationship between the aspect ratio of the inorganic filler particles, and fluidity and formability of the resin composition, is described. In the event that the aspect ratio is low, since a length of the inorganic filler particles is shorter than a diameter thereof, the inorganic filler particles may freely move within the resin composition for packaging. Accordingly, when the aspect ratio is lower than a predetermined value, the fluidity of the resin composition for packaging may be improved and formability of the resin composition for packaging may be improved. In the event that the aspect ratio is greater than the predetermined value, since the length of the inorganic filler particles is longer than the diameter thereof, interference between inorganic filler particles in the resin composition for packaging may occur, making it difficult to move the inorganic filler particles. Accordingly, when the aspect ratio is greater than the predetermined value, the fluidity of the resin composition for packaging may be deteriorated and formability of the resin composition for packaging may be deteriorated.

Figure 6:
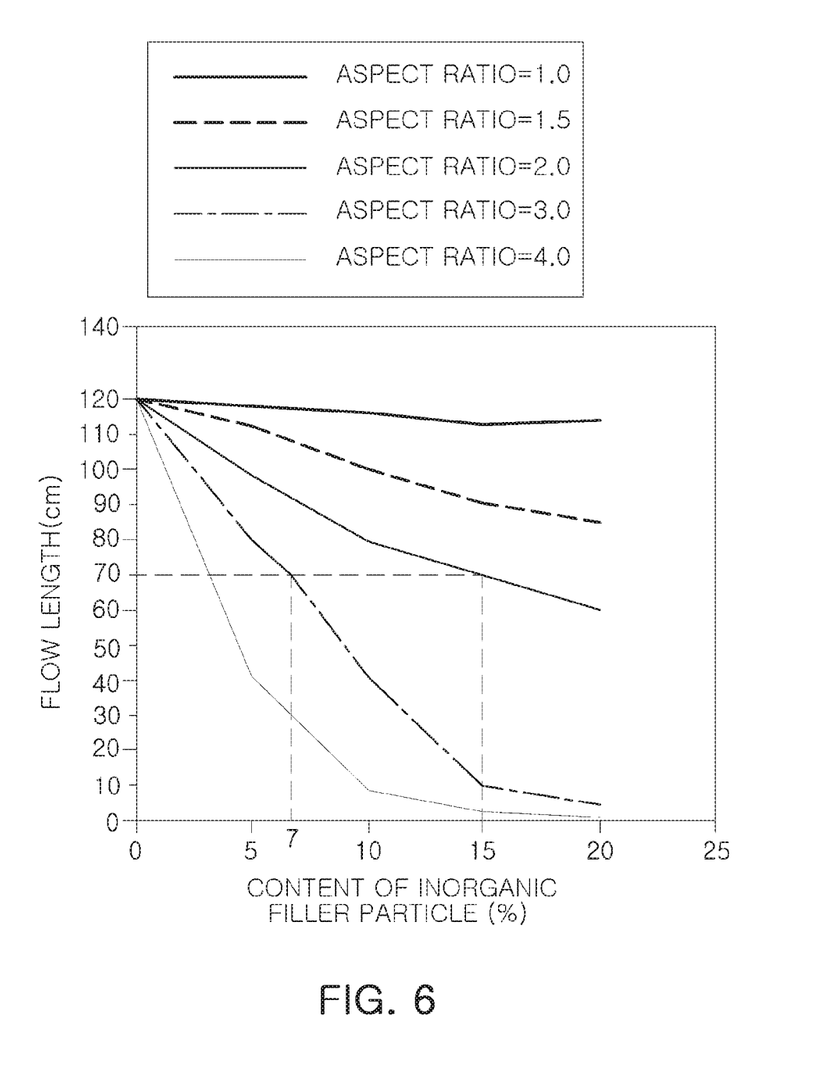
FIG. 6 is a graph illustrating a relationship among a content of inorganic filler particles included in an example of a resin composition, an aspect ratio thereof, and a flow length.

Hereinafter, a relationship between the aspect ratio of the inorganic filler particles included in the resin composition according to an example of the present description and flow length, is described with reference to FIG. 6. FIG. 6 is a graph illustrating a relationship among a content of the inorganic filler particles included in the resin composition in the present disclosure, an aspect ratio thereof, and a flow length.

FIG. 6 illustrates flow lengths measured by spiral flow test. A spiral flow mold having a rectangular groove formed in a spiral was used, and glass fibers each having a diameter of 13 μm and having lengths of 13, 32.5, 26, 39, 52 μm were used as inorganic filler particles. Samples were prepared by controlling the content of each inorganic filler particles in the epoxy resin, and flow lengths were measured in the spiral flow mold. The content of the inorganic filler particles is a volume fraction relative to the epoxy resin.

Referring to FIG. 6, it may be appreciated that, as the aspect ratio of the inorganic filler particles is increased, fluidity may be reduced. Further, as the content of the inorganic filler particles is increased, fluidity may be reduced.

When the aspect ratio is 1.0, it may be appreciated that since the diameter and the length of the inorganic filler particles are the same, reductions in fluidity are not significant, even in the case that the content of the inorganic filler particles is increased. When the aspect ratio is 1.5, it may be appreciated that since the flow length is more than 80 cm even in a case in which the content of the inorganic filler particles is more than 20%, reductions in fluidity are not significant. Accordingly, when the aspect ratio is 1.0 to 1.5, it may be appreciated that even though the content of the inorganic filler particles is greater than 20%, the formability of the resin composition may be excellent.

When the aspect ratio is 2.0 and the content of the inorganic filler particles is greater than 15%, the flow length is more than 70 cm, such that fluidity may be deteriorated. When the flow length is less than 70 cm, the formability of the resin composition may be poor, such that the resin composition having the flow length of less than 70 cm may not be suitable for manufacturing the insulating film. Accordingly, when the aspect ratio of the inorganic filler particles is 2.0, the content of the inorganic filler particles may be 15% or less based on the total volume of the resin composition for packaging.

When the aspect ratio is 3.0 and the content of the inorganic filler particles is more than 7%, the flow length is less than 70 cm, such that fluidity may be deteriorated. When the flow length is less than 70 cm, the formability of the resin composition may be poor, such that the resin composition having the flow length of less than 70 cm may not be suitable for manufacturing an insulating film. Accordingly, when the aspect ratio of the inorganic filler particles is 3.0, the content of the inorganic filler particles may be 7% or less based on the total volume of the resin composition.

When the aspect ratio is 4.0, the flow length is less than 70 cm, even in a case in which the content of the inorganic filler particles is less than 5%, such that fluidity may be deteriorated. Accordingly, when the aspect ratio of the inorganic filler particles is 4.0, the formability of the resin composition may be poor, even in a case in which the content of the inorganic filler particles is low.

Therefore, according to one example of the present description, the resin composition for packaging includes the inorganic filler particles having an aspect ratio of 3.0 or less, such that fluidity and formability thereof may be maintained to be excellent.

As described above, the aspect ratio of the inorganic filler particles has an influence on close adhesion of the resin composition for packaging. When the aspect ratio is low, since the length of the inorganic filler particles is shorter than the diameter, an amount of the inorganic filler particles penetrating into the conductive wire disposed on the insulating film, may be low. Accordingly, in the event that the aspect ratio is lower than a predetermined value, an increase in adhesion between the insulating film and the conductive wire may not be sufficient. In the event that the aspect ratio is greater than the predetermined value, since the length of the inorganic filler particles is longer than the diameter thereof, an amount of the inorganic filler particles penetrating into the conductive wire disposed on the insulating film, may be increased. Accordingly, when the aspect ratio is greater than the predetermined value, adhesion between the insulating film and the conductive wire, may be sufficiently increased.

Hereinafter, a relationship between an aspect ratio of the inorganic filler particles included in the resin composition according to an example of the present description and close adhesion, is described with reference to FIG. 7. The graph of FIG. 7 illustrates a relationship among a content of the inorganic filler particles included in a resin composition according to an example of the present description, an aspect ratio thereof, and close adhesion.

Figure 7:
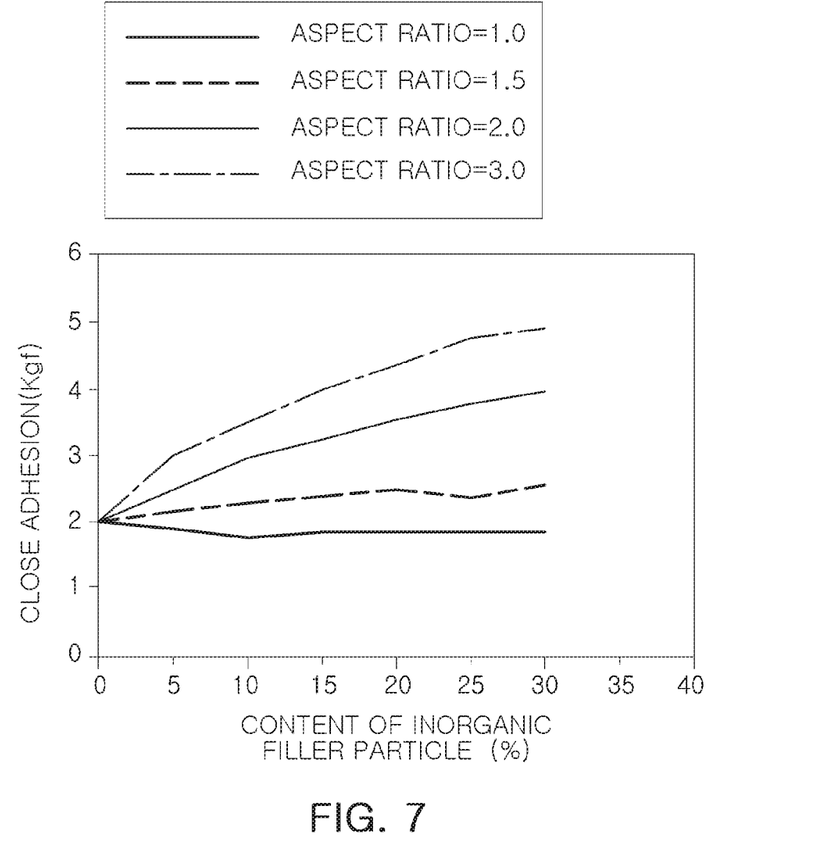
FIG. 7 is a graph illustrating a relationship among a content of inorganic filler particles included in an example of a resin composition, an aspect ratio thereof, and close adhesion.

FIG. 7 illustrates close adhesion measured by a load test. Glass fibers each having a diameter of 13 μm and having a length of 13, 32.5, 26, and 39 μm were used as inorganic filler particles. After the insulating film was manufactured by controlling the content of each inorganic filler particles in the epoxy resin, via holes were formed in the center of the insulating film to penetrate through the insulating film, such that portions of the inorganic filler particles were exposed to the via holes. The via holes were filled with the resin composition without including the inorganic filler particles, and then dried and cured. Load at the time at which a portion formed of the resin composition without including the inorganic filler particles is separated was measured by applying load to the portion formed of the resin composition without including the inorganic filler particles, and results thereof were shown in FIG. 7. The content of the inorganic filler particles refers to a volume fraction relative to the epoxy resin.

Referring to FIG. 7, it may be appreciated that as the aspect ratio of the inorganic filler particles is increased, close adhesion may be increased, and as the content of the inorganic filler particles is increased, close adhesion may be increased.

When the aspect ratio is 1.0, even though the content of the inorganic filler particles is increased, an increase in close adhesion is not exhibited. That is because the diameter and the length of the inorganic filler particles are the same as each other, such that the number of inorganic fillers connecting different materials such as the insulating films 11, 12, and 13 and the conductive wire 21 is low.

It may be appreciated that when the aspect ratio is 1.5, 2.0, or 3.0 which is 1.0 or more, as the content of the inorganic filler particles is increased, close adhesion is increased. Accordingly, the resin composition for packaging according to an example of the present description may improve close adhesion by including the inorganic filler particles having an aspect ratio of 1.0 or more.

Figure 8:
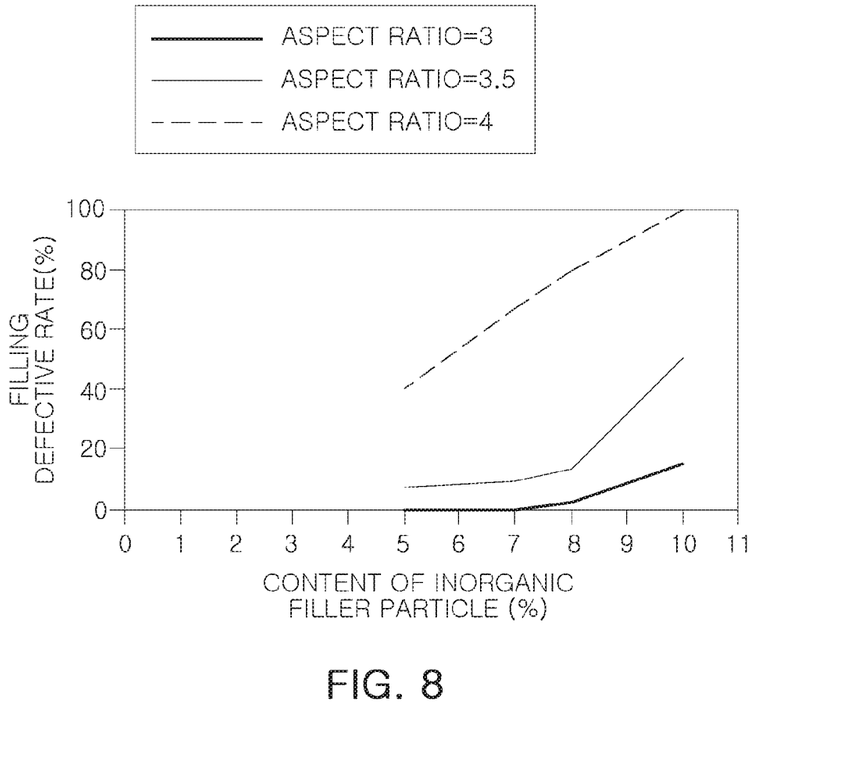
FIG. 8 is a graph illustrating a relationship among a content of inorganic filler particles included in an example of a resin composition, an aspect ratio thereof, and a filling defective rate.

Hereinafter, a relationship between an aspect ratio of the inorganic filler particles included in the resin composition according to an example of the present description and filling defective rate, is described with reference to FIG. 8. FIG. 8 is a graph illustrating a relationship among a content of the inorganic filler particles included in an example of a resin composition, an aspect ratio thereof, and a filling defective rate.

FIG. 8 illustrates results obtained by filling a substrate including grooves having concave and convex portions with a resin composition, and then observing whether the grooves of the substrate are filled, by microscope. In this example, grooves having concave and convex portions with a thickness of 0.5 mm and a width of 0.11 mm were formed on the substrate having a size of 104 mm×52 mm×1.1 mm using the epoxy resin, and the depressed spaces of the grooves were each filled with the resin compositions. Each of the resin compositions included a phenolic curing agent and glass fibers each having an aspect ratio of 3, 3.5 and 4, and the epoxy resin. In FIG. 8, the "filling defective rate (%)" refers to a ratio of the substrate samples in which non-filling occurred.

Referring to FIG. 8, it may be appreciated that filling defect occurs in the samples in which the aspect ratio of the inorganic filler particles is more than 3.0. In addition, it may be appreciated that filling defect occurs in the sample in which the content of the inorganic filler particles is more than 7% based on the total volume of the resin composition for packaging even in a case in which the aspect ratio of the inorganic filler particles is 3.0.

Upon summarizing test results of FIGS. 6 through 8, the resin composition for packaging having excellent fluidity, formability and close adhesion according to an example of the present description may be provided by including the epoxy resin and the inorganic filler particles, and controlling a length/diameter ratio (an aspect ratio) of the inorganic filler particles to be 1.0 or more to 3.0 or less. For example, when the aspect ratio of the inorganic filler particles is 2.0, the inorganic filler particles having the content of 15% or less based on a total volume of the resin composition for packaging, or when the aspect ratio of the inorganic filler particles is 3.0, the inorganic filler particle content is 7% or less based on a total volume of the resin composition for packaging, may be added, thereby providing the resin composition for packaging having excellent fluidity, formability and close adhesion.

According to another example, the resin composition may include the above-described filler, and may further include other inorganic filler particles, organic fillers, or mixtures thereof.

The inorganic filler particle is not specifically limited in its material. However, examples of suitable materials for the inorganic filler particles include at least one selected from the group consisting of alumina, aluminum nitride, boron nitride, fused silica, silicon nitride, and Teflon.

The organic filler is not specifically limited, but may, for example, include at least one selected from the group consisting of thermoplastic liquid crystal polymer resin, cellulose, carbon nanotube, graphene, and graphite, or a mixed filler.

The contents of the inorganic filler particles and the organic filler may be freely changed in consideration of coefficient of thermal expansion, adhesion strength, and the like, of an insulating layer manufactured using the resin composition.

The resin composition according to an example may further include a curing agent. The curing agent used in the resin composition is not specifically limited as long as the curing agent allows the epoxy resin to be cross-linked and cured. Examples of the curing agent include a phenolic curing agent (phenol resin), a cyanate ester-based curing agent, an activated ester-based curing agent, and the like. The curing agent may reduce surface roughness of the insulating layer manufactured using the resin composition.

Insulating Film

An example of an insulating film according to the present description is manufactured using the resin composition for packaging including: an epoxy resin; and inorganic filler particles, wherein a length/diameter ratio (an aspect ratio) of the inorganic filler particles is 1.0 or more to 3.0 or less.

A method for manufacturing the insulating film is not limited to one example. Rather, the insulating film may be manufactured by methods generally used in the art.

As an example, inorganic filler particles may be added to an oligomer solution containing a liquid crystal oligomer, followed by stirring. Then, an epoxy resin may be added thereto, followed by stirring. Next, additives such as a curing agent, and the like, may be added thereto, followed by further stirring, and the obtained mixture may be dried in about 100° C. of oven, and cured, thereby manufacturing the insulating film. In addition, as needed, the mixture obtained by adding the additives and further stirring, may be applied onto a copper film, another insulating layer, or the like, and dried in the oven, thereby manufacturing the insulating film.

Since the resin composition is the same as the above-described resin composition, overlapped description of the resin composition is not described.

Printed Circuit Board

FIG. 1 is a cross-sectional view schematically illustrating an example of a printed circuit board according to the present disclosure, and FIG. 2 is an enlarged cross-sectional view of part A of FIG. 1.

Referring to FIGS. 1 and 2, the printed circuit board according to an example may include insulating films 11, 12, and 13, and a conductive wire 21 formed by being penetrating into one surface of the insulating films 11, 12, and 13. The insulating films 11, 12, and 13 may be manufactured using a resin composition for packaging, the resin composition for packing including an epoxy resin and inorganic filler particles 30, and a length/diameter ratio (an aspect ratio) of the inorganic filler particles 30 being 1.0 or more to 3.0 or less.

Since the resin composition is the same as the above-described resin composition, overlapped description of the resin composition is not described.

At least one conductive wire 21 may be formed on one surface or both surfaces of the insulating films 11, 12, and 13, and via electrodes 22 may vertically penetrate through the insulating films 11, 12, and 13 to be connected to each other, thereby electrically connecting each conductive wire 21.

After the printed circuit board may be formed by forming a copper film layer on at least one surface of the insulating films 11, 12, and 13, and removing a portion of the copper film layer to form the conductive wire 21. In addition, before the copper film layer is formed, via hole may be formed on one surface of the insulating films 11, 12, and 13, and filled with conductive materials to form the via electrodes 22. The printed circuit board may be manufactured by repeating a process in which the insulating films 11, 12, and 13 are stacked on upper portions of the insulating films 11, 12, and 13 in which the conductive wire 21 is formed, and then copper film layers are formed thereon. The printed circuit board may include a capacitor, a resistor element, or other electronic components, as needed. In addition, the printed circuit board may be provided with a solder resist layer at an outermost portion in order to protect a circuit board. The printed circuit board may be provided with external connection devices, or occasionally a pad layer, depending on electronics to be mounted.

When a width of a lower part in a location at which the conductive wire 21 penetrates into one surface of each of the insulating films 11, 12, and 13 is a, and a length of the inorganic filler particles 30 is c, the ratio c/a may be ½ or less. Accordingly, the conductive wire 21 may be stably formed.

In order to form the conductive wires 21, the resin composition including the epoxy resin and the inorganic filler particles 30 according to an example of the present description may be used to form the insulating films 11, 12, and 13, and portions of the upper surfaces of the insulating films 11, 12, and 13 may be etched to remove portions in which the conductive wires 21 are to be formed, thereby forming via holes. In this case, a portion of the inorganic filler particles 30 may be released to inner side surfaces and lower surfaces of the via holes. Then, the conductive wires 21 may be formed by filling the via holes with conductive materials. If the length of the inorganic filler particles 30 is longer than a lower width of the via hole in which the conductive wire 21 is to be formed, the inorganic filler particles 30 may occupy substantial portions of the via holes. Accordingly, the inorganic filler particles 30 may inhibit the conductive material from filling inner portions of the via holes, and the conductive wire 21 may not be appropriately formed in the via holes, which may reduce adhesion between the conductive wire 21 and the insulating films 11, 12, and 13, such that the conductive wire 21 may be delaminated, or defects such as crack, and the like, may occur in the conductive wire 21.

As described above, in the printed circuit board according to an example of the present description, the length of the inorganic filler particles 30 is less than ½ of the width of the lower part of the conductive wire 21, thereby stably forming the conductive wire 21.

Meanwhile, although the printed circuit board having a four (4)-layer structure is illustrated in FIG. 1, the present description is not limited thereto. According to the number of insulating films 11, 12, and 13 to be stacked and circuit patterns to be formed, a single layer conductive wire 21 substrate or a multilayer conductive wire 21 substrate having two or more layers, may be formed.

The insulating films 11, 12, and 13 of the printed circuit board are formed of the resin composition according to an example of the present description as described above in detail.

As set forth above, according to an example of the present description, the resin composition for packaging, and the insulating film and the printed circuit board using the same, may have excellent thermal properties and adhesive properties.

While this disclosure includes specific examples, it will be apparent to one of ordinary skill in the art that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A resin composition for packaging, comprising:
an epoxy resin; and
inorganic filler particles dispersed in the epoxy resin,
wherein an aspect ratio of the inorganic filler particles is between 1 and 3, and an inorganic filler particle content of the resin composition is determined based on the aspect ratio.

2. The resin composition for packaging of claim 1, wherein the resin composition has the inorganic filler particle content of 15% or less based on a total volume of the resin composition.

3. The resin composition for packaging of claim 1, wherein the aspect ratio of the inorganic filler particles is approximately 2.0, and the resin composition has the inorganic filler particle content of 15% or less based on a total volume of the resin composition.

4. The resin composition for packaging of claim 1, wherein the aspect ratio of the inorganic filler particles is approximately 3.0, and the resin composition has the inorganic filler particle content of 7% or less based on a total volume of the resin composition.

5. The resin composition for packaging of claim 1, wherein the aspect ratio of the inorganic filler particles is between 1.5 and 2.5, and the resin composition has the inorganic filler particle content of between 5% and 15% based on a total volume of the resin composition.

6. The resin composition for packaging of claim 1, wherein the inorganic filler particles are substantially uniformly dispersed within the resin composition.

7. The resin composition for packaging of claim 1, wherein the inorganic filler particles have a columnar shape with one end being circular.

8. The resin composition for packaging of claim 1, wherein the inorganic filler particles have a columnar shape with one end having an oval shape.

9. The resin composition for packaging of claim 1, wherein the inorganic filler particles have a pipe shape.

10. The resin composition for packaging of claim 1, wherein the inorganic filler particles comprise any one or any combination of any two or more of silica, glass, calcium carbonate.

11. A printed circuit board comprising:
an insulating film manufactured using a resin composition for packaging, the resin composition comprising an epoxy resin and inorganic filler particles dispersed in the epoxy resin, an aspect ratio of the inorganic filler particles being between 1 and 3, and an inorganic filler particle content being determined based on the aspect ratio; and
a conductive wire formed on the insulating film.

12. The printed circuit board of claim 11, wherein the conductive wire protrudes into a surface of the insulating film by forming a depression, and
a ratio c/a is equal to or less than ½,
wherein a width of a lower part of the depression at which the conductive wire protrudes into one surface of the insulating film is a, and a length of the inorganic filler particles is c.

13. A method of manufacturing a printed circuit board, the method comprising:
forming an insulating film using a resin composition, the resin composition comprising an epoxy resin and inorganic filler particles dispersed in the epoxy resin, an aspect ratio of the inorganic filler particles being between 1 and 3, and an inorganic filler particle content being determined based on the aspect ratio; and
forming a conductive wire to contact the insulating film.

14. The method of claim 13, wherein the forming of the insulating film comprises molding the insulating film to have a depression, and
the forming of the conductive wire comprises filling the depression with a conductive material.

15. The method of claim 14, wherein at least a portion of inorganic filler particles disposed at an interface between the insulating film and the conductive wire filled in the depression embeds into both the insulating film and the conductive wire.

16. The resin composition for packaging of claim 1, wherein the inorganic filler particle content of the resin composition increases as the aspect ratio of the inorganic filler particles decreases.

17. The resin composition for packaging of claim 1, wherein the inorganic filler particle content and the aspect ratio are determined based on a flow length of the resin composition measured with a spiral flow test.

18. The resin composition for packaging of claim 1, wherein the inorganic filler particle content and the aspect ratio are determined based on either one or both of a measure of adhesion of the inorganic filler particles and a measure of filling defective rate of the inorganic filler particles.

* * * * *